United States Patent
Farooq et al.

(10) Patent No.: US 7,622,737 B2
(45) Date of Patent: Nov. 24, 2009

(54) TEST STRUCTURES FOR ELECTRICALLY DETECTING BACK END OF THE LINE FAILURES AND METHODS OF MAKING AND USING THE SAME

(75) Inventors: Mukta G. Farooq, Hopewell Junction, NY (US); Xiao H. Liu, Briarcliff Manor, NY (US); Ian D. Melville, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/776,114

(22) Filed: Jul. 11, 2007

(65) Prior Publication Data

US 2009/0015285 A1 Jan. 15, 2009

(51) Int. Cl.
*H01L 23/58* (2006.01)
*H01L 21/00* (2006.01)
(52) U.S. Cl. .................... 257/48; 438/17; 257/E21.531
(58) Field of Classification Search .................. 257/48; 438/17
See application file for complete search history.

(56) References Cited

U.S. PATENT DOCUMENTS

| | | | |
|---|---|---|---|
| 5,262,719 A | 11/1993 | Magdo | |
| 6,564,986 B1 | 5/2003 | Hsieh | |
| 6,633,083 B2 | 10/2003 | Woo et al. | |
| 6,693,417 B2 | 2/2004 | Wilson | |
| 6,861,748 B2 | 3/2005 | Low et al. | |
| 7,098,676 B2 | 8/2006 | Landers et al. | |
| 7,164,149 B2 * | 1/2007 | Matsubara | ................. 257/48 |
| 7,223,673 B2 * | 5/2007 | Wang et al. | ................. 438/460 |
| 2002/0151093 A1 | 10/2002 | Woo et al. | |
| 2002/0190729 A1 | 12/2002 | Wilson | |
| 2004/0096995 A1 | 5/2004 | Low et al. | |
| 2004/0129938 A1 | 7/2004 | Landers et al. | |
| 2005/0082466 A1 | 4/2005 | Smith et al. | |

FOREIGN PATENT DOCUMENTS

| | | |
|---|---|---|
| JP | 07-193108 | 7/1995 |
| JP | 11-214568 | 8/1999 |
| JP | 09-312317 | 12/2007 |

OTHER PUBLICATIONS

Hopper, "Test-Site Design for Monitoring Cracked SiO2", IBM Technical Disclosure Bulletin, [online]; [retrieved on Jan. 8, 2007]; retrieved from https://www.delphion.com/tdbs/tdb?order=83A+61506.

* cited by examiner

*Primary Examiner*—W. David Coleman
(74) *Attorney, Agent, or Firm*—Cantor Colburn LLP; Katherine Brown

(57) ABSTRACT

Test structures for electrically detecting BEOL failures are provided. In an embodiment, the structure comprises: an input/output connection disposed above a primary conductive pad which is embedded in an insulator; a dielectric layer disposed upon the insulator; a primary via extending through the dielectric layer down to the primary conductive pad for providing electrical connection between the input/output connection and the primary conductive pad; and a secondary via filled with a conductive material in electrical connection with the input/output connection, the secondary via extending through the dielectric layer down to a secondary interconnect in electrical connection with a secondary conductive pad that is insulated from the primary conductive pad.

19 Claims, 7 Drawing Sheets

TEST STRUCTURES FOR ELECTRICALLY DETECTING BACK END OF THE LINE FAILURES AND METHODS OF MAKING AND USING THE SAME

BACKGROUND OF THE INVENTION

1. Field of the Invention

This invention relates to integrated circuits and particularly to test structures for electrically detecting back end of the line failures.

2. Description of Background

Current semiconductor integrated circuits (ICs) are mass produced by forming an array of chips electrically connected together on a thin semiconductor wafer. Each array location is known as a die, and each die can include a multilayered IC chip or a structure for test or alignment. A connection pad for connecting to circuit inputs and outputs (I/Os) and a power source(s) can be located at the surface of each die. An insulator can surround the connection pads for insulating them from each other. During far back end of the line (FBEOL) processing, a via can be etched through one or more passivation layers down to the connection pad of each die. Each via can be filled with a metal interconnect to provide connection to the underlying connection pad. Solder balls (e.g., controlled collapsible chip connections (C4s)) can then be formed or bumped on the pads for conducting electrical signals from the integrated circuit to a substrate connected to a printed circuit board (PCB).

During performance testing, test fixtures can contact inputs to the C4 solder balls to ensure electrical continuity between the various connection pads of the die. The test fixtures can be used to electrically detect the failure of the circuit due to damage such as cracks. Such cracks can arise as a result of the module being subjected to thermal cycling that causes the die to expand and contract, usually at a different rate than the substrate (e.g., a Flip Chip Plastic Ball Grid Array (FCP-BGA)) to which it is attached. Unfortunately, such testing usually only detects C4 solder-specific failures. However, BEOL failures directly associated with the BEOL insulator region, passivation layers, and interconnect remain undetectable using such testing.

In the past, this inability to detect BEOL failures has been overcome by additionally examining semiconductor die using a scanning electron microscope (SEM), thermal electron microscope (TEM), a focused ion beam (FIB), sonoscan imaging, etc. However, this type of examination can itself cause damage to the die. Further, the examination of the die can only be performed periodically rather than continuously in real time, thus limiting the understanding of the mechanism and root cause of the BEOL failures. Moreover, such techniques cannot detect damage after the chip is fully assembled to the substrate, including damage to the lid and heat sink attachment.

A need therefore remains for a way to electrically detect BEOL damage not directly affecting the main connections to the conductive pads disposed near the high risk areas of the die.

SUMMARY OF THE INVENTION

The shortcomings of the prior art are overcome and additional advantages are provided through the provision of a test structure for detecting BEOL failures. In accordance with an embodiment, a structure for electrically testing a semiconductor topography comprises: an input/output connection disposed above a primary conductive pad which is embedded in an insulator; a dielectric layer disposed upon the insulator; a primary via extending through the dielectric layer down to the primary conductive pad for providing electrical connection between the input/output connection and the primary conductive pad; and a secondary via filled with a conductive material in electrical connection with the input/output connection, the secondary via extending through the dielectric layer down to a secondary interconnect in electrical connection with a secondary conductive pad that is insulated from the primary conductive pad.

In another embodiment, a method of forming a structure for testing a semiconductor topography comprises: providing a primary conductive pad, a secondary conductive pad spaced laterally from the primary conductive pad, and a secondary interconnect in electrical connection with the secondary conductive pad, all of which are embedded in an insulator; forming a dielectric layer upon the insulator, the primary and secondary conductive pads, and the secondary interconnect; and etching a primary via through the dielectric layer down to the primary conductive pad and a secondary via through the dielectric layer down to the secondary interconnect.

In yet another embodiment, a method of electrically testing a semiconductor die comprises: supplying an electrical current to an input/output connection in electrical connection with a primary conductive pad spaced from a secondary conductive pad in an insulator, the primary conductive pad being in electrical connection with a circuit chip, and the secondary conductive pad being disposed near a periphery of the semiconductor die.

Additional features and advantages are realized through various embodiments. Other embodiments and aspects are described in detail below and are considered a part of the claimed invention. For a better understanding of the various embodiments with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
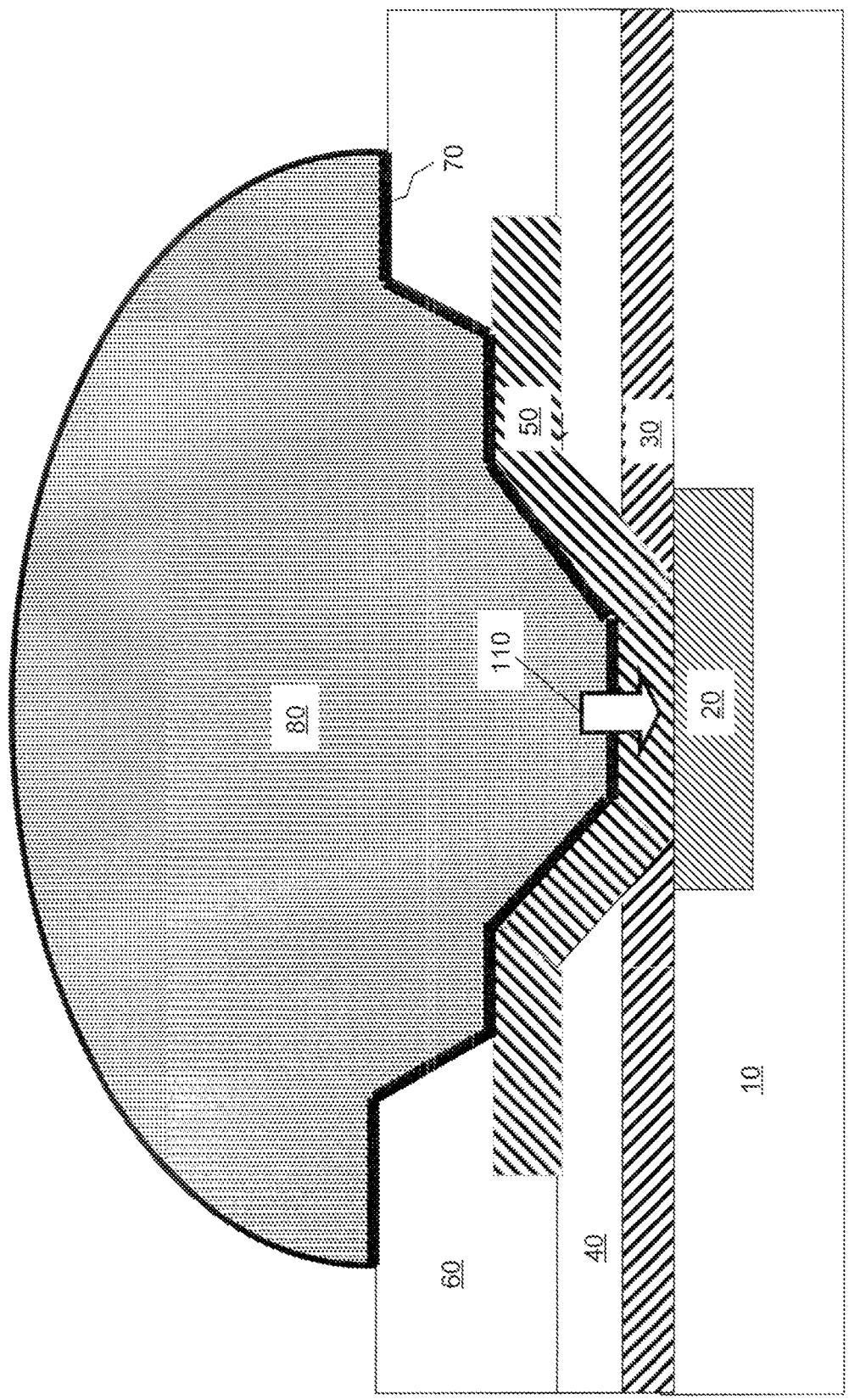
FIG. 1 illustrates a prior art back end of the line (BEOL) structure for connecting a die to circuit input/outputs and power source(s)

Turning now to the drawings in greater detail, FIG. 1 depicts an exemplary BEOL structure currently being used to test a semiconductor wafer. The structure includes an insulator 10 in which a primary conductive pad 20 (also known as a connection pad or terminating pad) is embedded. The primary conductive pad 20 is in electrical connection with a circuit chip or device that can belong to an array of circuit chips/devices (not shown). The dielectric layers 30 and 40 (also known as passivation layers) are stacked upon the insulator 10/conductive pad 20 layer. A primary interconnect 50 extends across a portion of the dielectric layer 40 and into a via, i.e., opening, extending through the dielectric layers 30 and 40 above the primary conductive pad 20. Another dielectric layer 60 is disposed upon the exposed regions of the dielectric layer 40 and the end regions of the interconnect 50. A conductive solder ball, e.g., a C4 80, is disposed above the primary conductive pad 20, the interconnect 50, and a portion of the dielectric layer 60. The C4 80 is formed down through a via disposed in the dielectric layer 60 above the upper surface of the interconnect 50. A ball limiting metallurgy 70 (BLM) (also known as an under bump metallurgy (UBM) or a pad limiting metallurgy (PLM)) is used to attach the C4 80 to the underlying semiconductor topography. In an alternative embodiment, the C4 80 can be replaced by a wirebond connection.

The BEOL test structure shown in FIG. 1 can be employed to monitor the main connection to the primary conductive pad 20 by supplying a current to a substrate input to which the C4 80 is electrically connected, which flows to the primary conductive pad 20 as indicated by arrow 110. The resistance to the current flow can be measured using a test fixture such as a test pin or probe. Thus, an increase in the resistance could indicate damage to the C4 80, the primary conductive pad 20, and/or the center of the primary interconnect 50. However, damage to areas of the BEOL structure outside of the main connection area, such the dielectric layers 30 and 40, would not be detectable.

Figure 2:
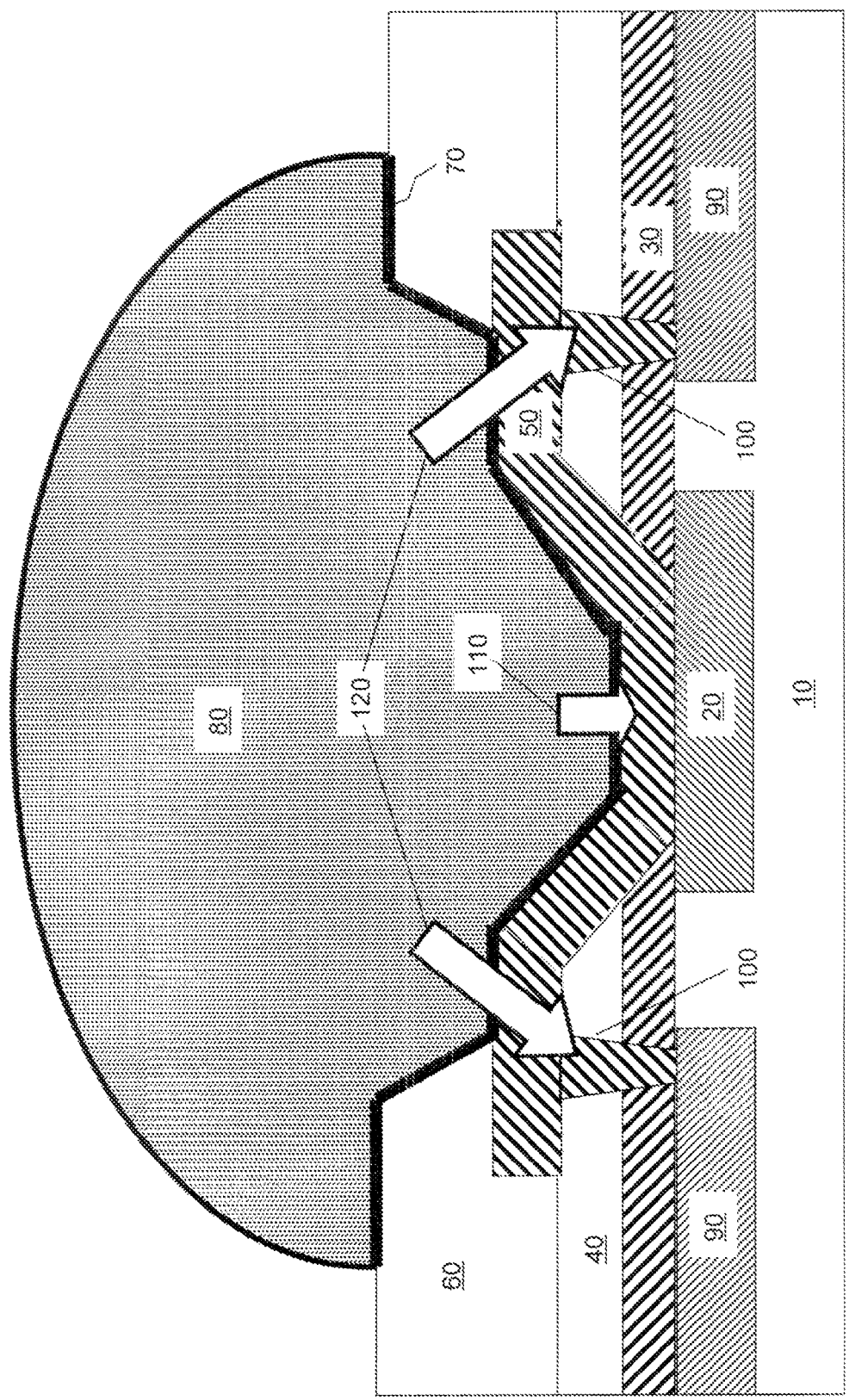
FIG. 2 illustrates one example of a BEOL structure for testing the failure of BEOL features such as BEOL dielectrics.

FIG. 2 depicts an exemplary embodiment of an improved BEOL test structure that can be used to detect damage to the BEOL structure outside of the main connection to the primary connection pad 20. The BEOL structure in FIG. 2 includes all of the same features as the structure shown in FIG. 1 and additionally includes vias 100 which are filled with a conductive material. The vias 100 extend from opposite ends of the primary interconnect 50, through the dielectric layers 30 and 40, and down to respective secondary interconnects 90. The secondary interconnects 90 can be in electrical connection with secondary conductive pads (shown later) separated from the primary conductive pad by the insulator 10.

The BEOL structure shown in FIG. 2 can be formed using the following semiconductor fabrication method. First, the primary conductive pad 20, the secondary interconnects 90, and the secondary conductive pad (not shown) can be formed in the insulator 10 such that the pads are connected through a terminal via to the underlying circuit chip/device wiring (not shown). Examples of suitable dielectric materials for insulator 10 include but are not limited to silicon oxide ($SiO_x$), tetraethylorthosilicate (TEOS), fluorinated tetraethylorthosilicate (FTEOS), borophosphosilicate glass (BPSG), etc., having dielectric constant (k) values of about 5.0 to about 4.0, low dielectric constant dielectric materials such as hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilil borxle (SOB), diaceloxyditerliarybutosiloxane (DADBS), trimethylsilil phosphate (SOP), etc., having dielectric constants below about 3.9 to about 2.5, and combinations comprising at least one of the foregoing dielectric materials. Examples of suitable commercially available ultra-low k dielectric materials, having dielectric constants below about 2.5, include but are not limited to Teflon-AF, Teflon microemulsion, polimide nanofoams, silica aerogels, silica xerogels, mesoporous silica, and combinations comprising at least one of the foregoing dielectric materials.

The formation of the conductive pad 20 and the secondary interconnect 90 involves first forming trenches in the insulator 10 at locations where the conductive pad 20 and the secondary interconnect 90 are to be formed. For example, photolithography can be used to form photoresist across select regions of the insulator 10 outside of where the trenches are to be formed, and an etch technique, such as a dry, plasma etch, can be used to etch those regions of the insulator 10 not protected by the photoresist. The photoresist can then be stripped, for example, by contacting it with acetone. A conductive material such as copper (Cu) or aluminum (Al) can then be deposited across the insulator 10 and into the trenches up to a level above the surface of the insulator 10. The relatively low resistivity of Cu makes it a preferred fill material. The conductive material remaining above the surface of the insulator 10 can subsequently be removed by, for example, using chemical-mechanical polishing (CMP). The resulting conductive pad 20 and secondary interconnect 90 can be about 0.3 to about 2 micrometers (microns ($\mu m$)) thick, specifically about 0.5 to about 1.2 microns thick.

Once the trenches in the insulator 10 have been filled to form conductive pads 20 and 90, the dielectric layers 30 and 40 can be sequentially deposited across the insulator 10 level. The dielectric layers 30 and 40 can comprise, for example, silicon dioxide, silicon nitride, silicon oxynitride, or a combination comprising at least one of the foregoing dielectrics. They can be deposited using a suitable method such as chemical vapor deposition or plasma enhanced chemical vapor deposition (PECVD). In a preferred embodiment, dielectric layer 30 is a silicon dioxide ($SiO_2$) layer, and dielectric layer 40 is a silicon nitride ($Si_3N_4$) layer, the combination of which has a thickness of about 1,000 to about 9,000 Angstroms (Å). The silicon dioxide layer serves to provide excellent insulation properties, and the silicon nitride layer serves to provide an excellent barrier to the migration of metal, e.g., Cu, from the conductive pad 20 and secondary interconnects 90. It is understood that the number of dielectric layers formed upon the insulator 10 can vary.

After the deposition of the dielectric layers 30 and 40, vias 100 can be selectively etched through the dielectric layers 30 and 40 down to the secondary interconnects 90 as shown, for example, by using photolithography followed by an etch technique such as a plasma etch. The duration of the etch can be selected to terminate after the removal of all of the exposed dielectric material. A via can also be selectively etched above the conductive pad 20, thus exposing the conductive pad 20. A conductive material such as Al can then be deposited into the vias 100 and upon exposed surfaces of the primary conductive pad 20 and the dielectric layer 40. Regions of the conductive material can then be removed from above the dielectric layer 40 to form the primary interconnect 50 as shown. The thickness of the primary interconnect 50 can range, for example, from about 0.5 to about 4 microns.

Although not shown, one or more barrier layers can also be formed underneath the primary interconnect 50 to inhibit the migration of metal from the conductive pad 20. Examples of such barrier layers include but are not limited to an AlCu layer, a barrier layer comprising titanium, titanium nitride, tantalum, tantalum nitride, or mixtures thereof, and combinations comprising at least one of the foregoing layers.

Subsequent to forming the primary interconnect 50, another dielectric layer 60 can be deposited upon exposed surfaces of the dielectric layer 40 and the interconnect 50. A region of the dielectric layer 60 from above the center of the interconnect 50 can be removed as shown. The dielectric layer 60 can be, for example, a photosensitive polyimide (PSPI), allowing it to be spin-deposited and patterned by exposing select regions of the PSPI to the appropriate radiation for increasing or decreasing its dissolution rate. The regions of the PSPI of lower dissolution rates can then be removed with an appropriate developer. Examples of suitable PSPI's include but are not limited to polyesterimides, polyimide-imide-esters, polyimide-imides, polysiloxaneimides, etc, and combinations comprising at least one of the foregoing PSPI's. The dielectric layer 60 can be about 0.4 to about 5 microns thick, more specifically about 10,000 to about 40,000 Å thick. A C4 80 can then be formed above the primary conductive pad 20 as shown by a plating process such that the C4 80 extends down to the exposed portion of the primary interconnect 50. The C4 80 can be substantially round in shape and can extend above the dielectric layer 60 by about 0.05 to 0.5 millimeters (mm), specifically about 0.1 mm. The C4 80 can include, for example, a lead-containing solder, e.g., lead-tin, or a non-lead solder, e.g., tin, silver, or copper. A ball limiting metallurgy (BLM) 70 can also be employed to adhere the C4 80 to underlying surfaces. Examples of suitable BLM materials include but are not limited to titanium, tungsten, tantalum, copper, chromium, nickel, and combinations comprising at least one of the foregoing BLM materials. In an alternative embodiment, the C4 80 can be replaced by a wirebond connection.

Figure 3:
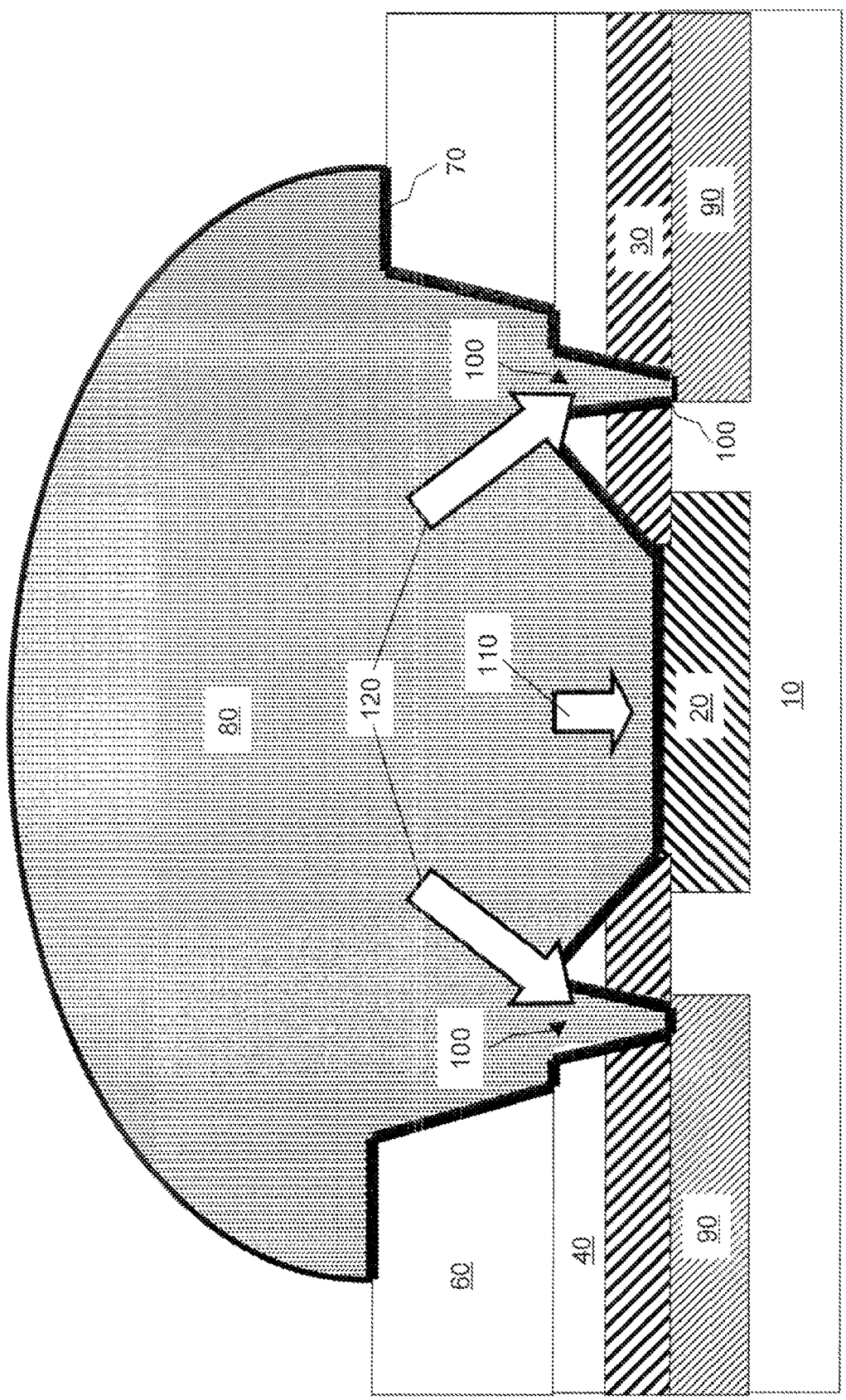
FIG. 3 illustrates another example of a BEOL structure for testing the failure of BEOL features such as BEOL dielectrics.

FIG. 3 depicts yet another exemplary embodiment of a BEOL structure which is the same as the embodiment shown in FIG. 2 except that it does not include an interconnect between the primary conductive pad 20 and the C4 80. Thus, the solder is formed within the vias 100 such that it directly contacts secondary interconnects 90, and it is also formed directly upon the primary conductive pad 20.

The size of each via 100 can be determined based on the relationship that the ratio of the via stress intensity factor ($K_{via}$) to the insulator stress intensity factor ($K_{crack}$) should be greater than the ratio of the fracture toughness of the conductive material in the via to the fracture toughness of the dielectric through which the via extends. If the size of the via is pre-selected instead of the conductive material, the required toughness of the conductive material in the via could also be determined based on the foregoing relationship. The following table provides a list of fracture toughness values for some suitable dielectric and conductive materials.

| | Fracture Toughness (MPa√m) |
|---|---|
| Al | 14-28 |
| $SiO_2$ | 0.85-1.15 |
| Si | 0.79-0.95 |
| $Si_3N_4$ | 7.2-8.3 |

| | Fracture Toughness (MPa√m) |
|---|---|
| Cu/63Sn—37Pb | 8.36¶ |
| Cu/Sn IMC | 2.36-2.38§ |

¶R. E. Pratt et al, J. Electronic Mat. Vol. 23, No. 4, 1994, pp. 375-381
§B. Balakrisnan et al, J. Electronic Mat. Vol. 32, No. 3, pp. 166-171

Figure 7:
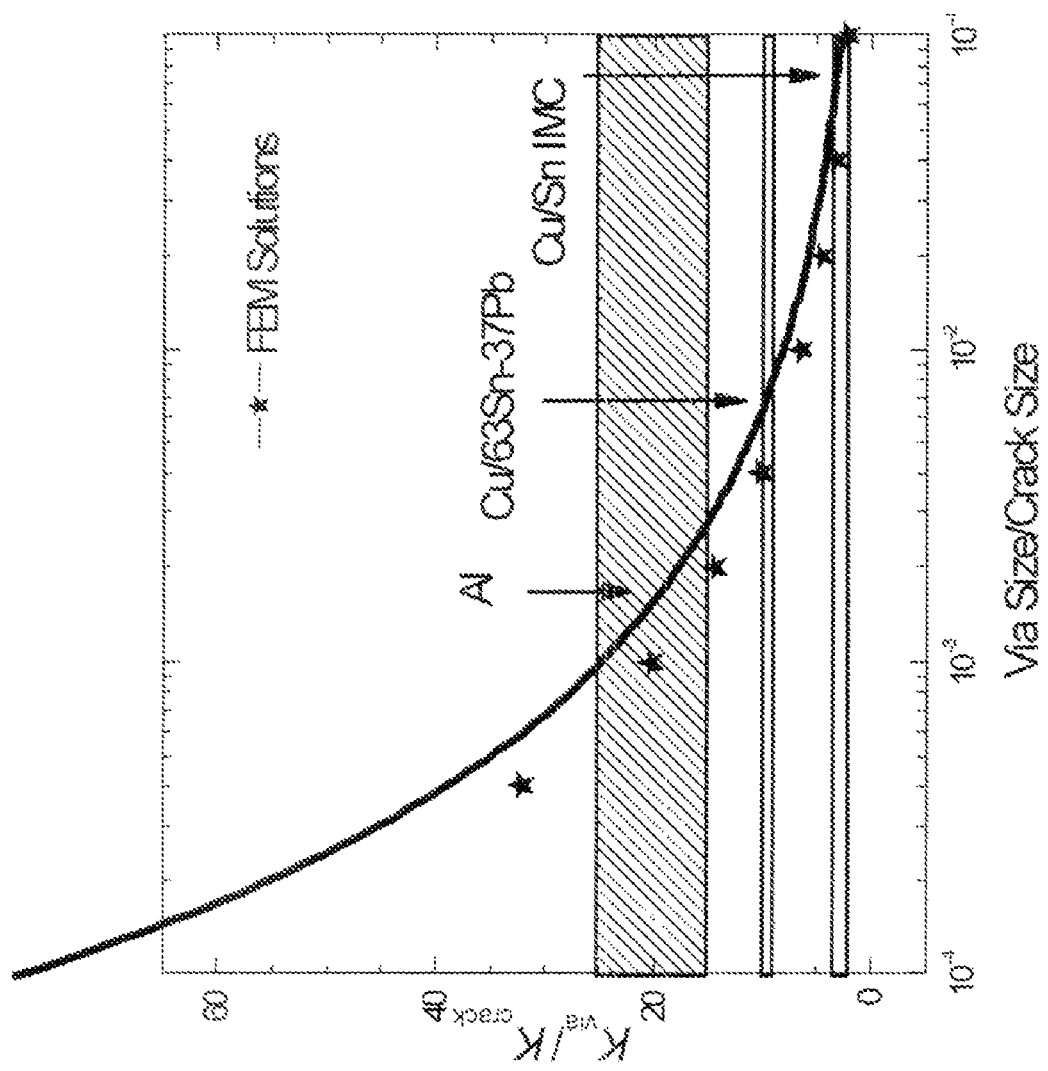
FIG. 7 illustrates a graph modeling the ratio of the stress intensity factor ($K_{via}$) at a via in a BEOL structure to the stress intensity factor at an insulator ($K_{crack}$) as a function of the ratio of the via size to the crack size and the fracture toughness for different conductive materials.

As illustrated by the graph in FIG. 7, the ratio of the via width to the crack length can be estimated by a model prediction obtained using fracture mechanics and finite element modeling. By way of example, if the via is filled with Al and it extends through a $SiO_2$ dielectric, the fracture toughness ratio of Al to $SiO_2$ is about 14 to 28, i.e., an average of about 20. Based on the model prediction shown in FIG. 7, the estimated ratio of the via width to the crack length for Al in $SiO_2$ is about $1 \times 10^{-3}$. Thus, to detect a crack length of 200 microns, the via size should be smaller than 0.2 micron.

Figure 4:
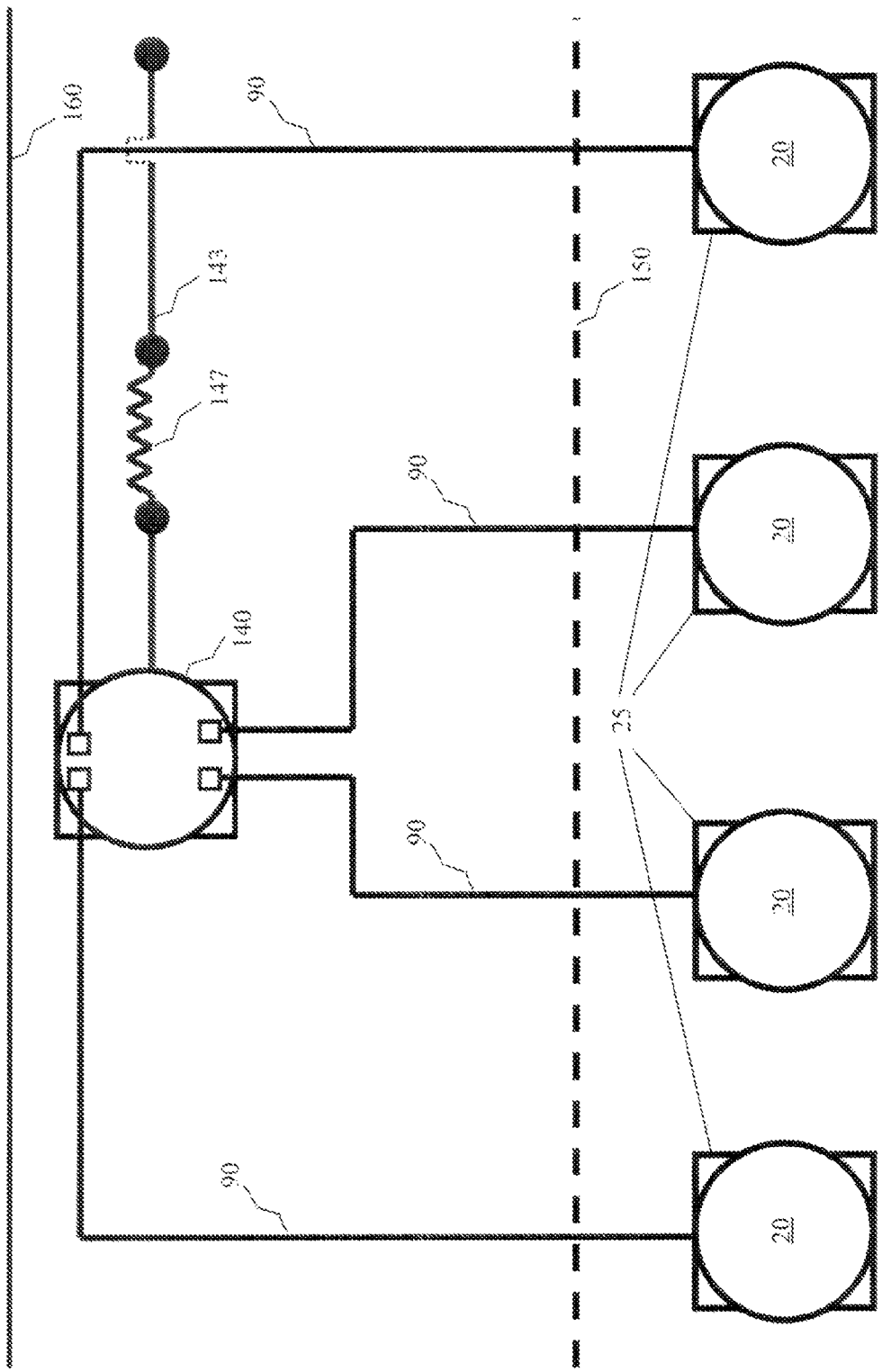
FIG. 4 illustrates one example of a circuit design for electrically monitoring the periphery of the die as well as the interior of a die for damage.

Turning now to FIG. 4, an exemplary circuit design for electrically monitoring the periphery of a semiconductor die as well as the interior of the die for damage is depicted. This circuit design can be used in conjunction with the BEOL test structure shown in FIG. 2 or 3. As shown, an array of primary conductive pads 20 and overlying BEOL structures 25 like the one in FIG. 2 are located near an interior of the semiconductor die, the boundary of which is illustrated by dashed line 150. These primary conductive pads 20 are in electrical connection with underlying circuit chips/devices. Further, a secondary conductive pad 140 can be located near an edge 160 of the semiconductor die. Secondary interconnects 90 run between the BEOL structures 25 and the secondary conductive pad 140. Also, an interconnect 143 that includes a relatively high resistance macro 147 can be formed between the secondary conductive pad 140 and another secondary conductive pad located near the wafer edge 160 in accordance with a currently used test method such as the 4pt Kelvin method. While not shown, the circuit design can include a plurality of secondary conductive pads strategically spaced along the chip edge 160 where the risk of damage to the die due to stress/strain can be highest. The secondary conductive pads are in electrical connection with the BEOL structures 25, allowing any damage occurring near the chip edge 160 to be detected as described below.

Unlike the BEOL test structure shown in FIG. 1, the BEOL test structure shown in FIG. 2 can be employed to detect damage to both the main connection to the primary conductive pad 20 and other areas of the semiconductor die. Such testing can be performed by applying a power source to a substrate input to which the C4 80 is electrically connected such that current flows to the primary conductive pad 20, as indicated by arrow 110, and to the secondary interconnects 90 through the vias 100, as indicated by arrows 120. The resistances to the different current flows can be measured independently through the associated substrate connections to the various C4s 80. A shift in the resistance to the current flowing to a particular area can indicate a failure of a particular feature of the BEOL structure.

Figure 5:
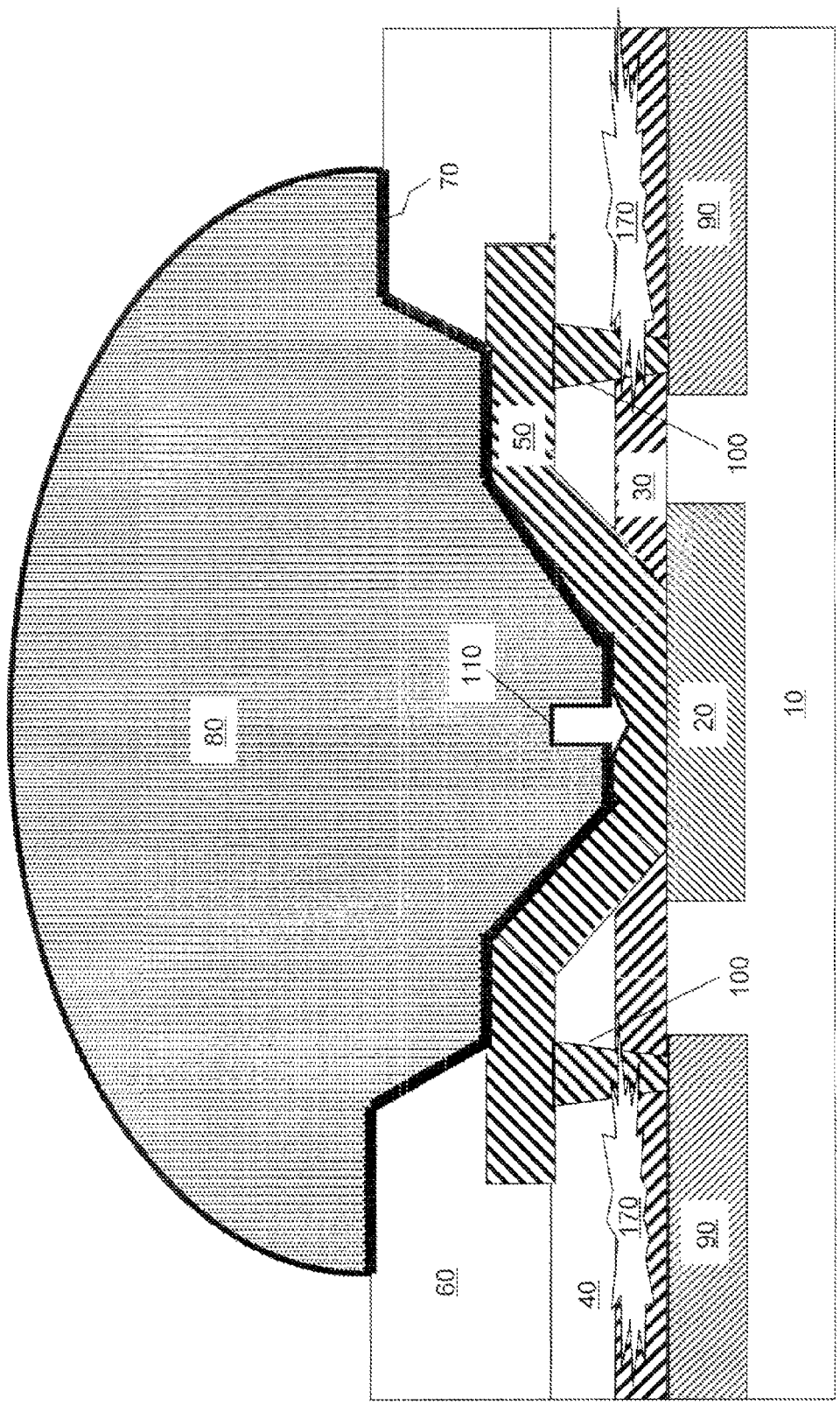
FIG. 5 illustrates the BEOL structure from FIG. 2 being used to detect a crack in a dielectric layer located outside of the main connection to the BEOL pad.
Figure 6:
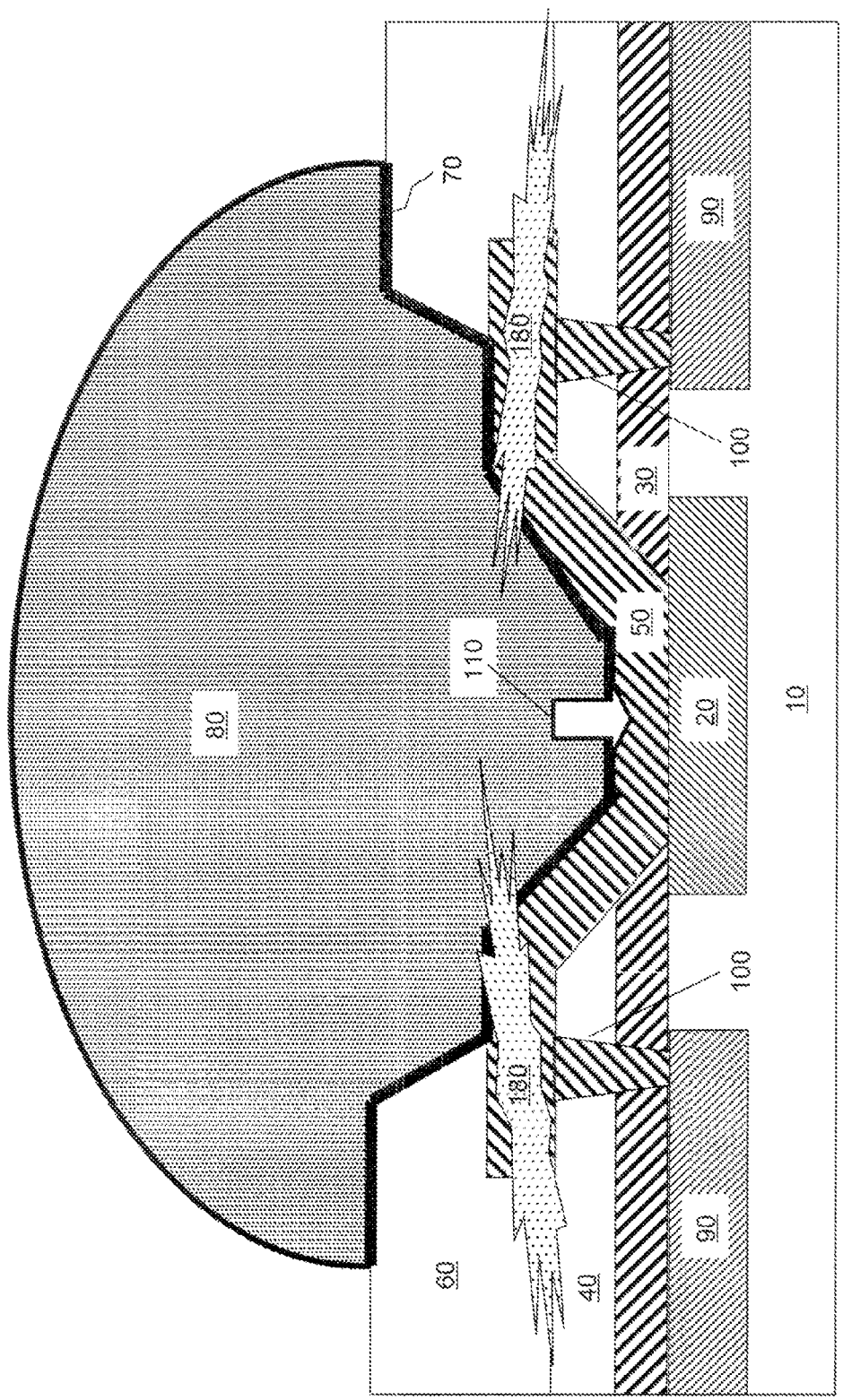
FIG. 6 illustrates the BEOL structure from FIG. 2 being used to detect a crack in an interconnect located outside of the main connection to the BEOL pad.

FIGS. 5 and 6 illustrate that the BEOL structures described herein can be used to detect damage such as cracks in areas of the BEOL structure outside of the main connection to the primary conductive pad 20. In FIG. 5, cracks 170 are present in the dielectric layers 30 and 40, and in FIG. 6, cracks 180 are present near the ends of the primary interconnect 50. The location of vias 100 laterally spaced from the main via to the primary conductive pad 20 ensures that such cracks can be detected at their onset before they grow to the center of the primary interconnect 50. Other examples of damage that the BEOL structures described herein can be used to detect include but are not limited to cracks in the secondary conduction pads disposed near the edge of the wafer, delamination of the BLM underneath the solder ball, cracks in the BLM, tearing of the conductive pad, cracks in the solder, etc. Lead-free solder and low k dielectrics, which can be used in the BEOL structures, are more susceptible to being damaged. Such damage can result in degradation of the functionality of the integrated circuit and thus the functionally of any apparatus employing the integrated circuit.

The BEOL structures described herein provide several advantages. For example, electrical testing of the BEOL structures advantageously can be performed in-situ without taking the semiconductor module off-line and thus without risking further damage to the die. Moreover, since different areas of the BEOL structure can be monitored separately, the exact feature that is damaged can be more easily determined. Another advantage is that the module can be continuously monitored in real time to detect specific failures, e.g., BEOL related failures, during the life of the integrated circuit. As such, the sequence of failures can be determined to allow the root cause of such failures to be established. Also, customers can be warned of the impending total failure of an integrated circuit, allowing time for mitigation of the actual total failure.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

As used herein, the terms "a" and "an" do not denote a limitation of quantity, but rather denote the presence of at least one of the referenced items. Moreover, the endpoints of all ranges directed to the same component or property are inclusive of the endpoints and are independently combinable (e.g., "in the range from about 5 wt. % to about 20 wt. %," is inclusive of the endpoints 5 and 20 and all values between 5 and 20). Reference throughout the specification to "one embodiment", "another embodiment", "an embodiment", and so forth means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments. Unless defined otherwise, technical and scientific terms used herein have the same meaning as is commonly understood by one of skill in the art to which this invention belongs.

While the preferred embodiment have been described, it will be understood that those skilled in the art, both now and in the future, may make various improvements and enhancements that fall within the scope of the following claims. These claims should be construed to maintain the proper protection embodiments first described.

What is claimed is:

1. A structure for electrically testing a semiconductor topography, comprising:
   an input/output connection disposed above a primary conductive pad which is embedded in an insulator;
   a dielectric layer disposed upon the insulator;
   a primary via extending through the dielectric layer down to the primary conductive pad for providing electrical connection between the input/output connection and the primary conductive pad; and
   a secondary via extending through the dielectric layer down to a secondary interconnect in electrical connection with a secondary conductive pad that is isolated from the primary conductive pad, wherein the primary and secondary vias are filled with conductive materials that are in electrical connection with the same input/output connection.

2. The structure of claim 1, further comprising a primary interconnect in electrical connection with the input/output connection and extending laterally above the secondary via and down through the primary via to the primary conductive pad.

3. The structure of claim 1, wherein the input/output connection is a solder ball that extends down through the primary via and the secondary via such that it is directly connected to the primary conductive pad and the secondary interconnect.

4. The structure of claim 1, wherein the semiconductor topography is a die, the primary conductive pad is located near an edge of the die, and the secondary conductive pad is located near an interior of the die and is in electrical connection with a circuit chip.

5. The structure of claim 1, wherein the structure is a Back End of the Line structure, and wherein the input/output connection is a solder ball connection or a wirebond connection.

6. The structure of claim 1, wherein the primary and secondary conductive pads comprise copper.

7. The structure of claim 1, wherein the dielectric layer comprises a silicon nitride layer and a silicon dioxide layer, a silicon oxynitride layer, or a combination comprising at least one of the foregoing layers.

8. The structure of claim 1, wherein a width of the secondary via or a toughness of a conductive material in the via is based on an estimated first ratio of a toughness of the secondary via to a toughness of a crack detected by the secondary via being greater than a second ratio of a toughness of the conductive material to a toughness of the dielectric layer.

9. The structure of claim 2, wherein the primary interconnect and the conductive material in the secondary via comprise aluminum.

10. A method of forming a structure for testing a semiconductor topography, comprising:
    providing a primary conductive pad, a secondary conductive pad spaced laterally from the primary conductive pad, and a secondary interconnect in electrical connection with the secondary conductive pad, all of which are embedded in an insulator;
    forming a dielectric layer upon the insulator, the primary and secondary conductive pads, and the secondary interconnect; and
    etching a primary via through the dielectric layer down to the primary conductive pad and a secondary via through the dielectric layer down to the secondary interconnect;
    filling the primary and secondary vias with a conductive material; and forming an input/output connection above the primary via that is in electrical connection with both the primary via and the secondary via.

11. The method of claim 10, wherein said filling the primary and secondary vias comprises:

depositing the conductive material in the primary and secondary vias up to a level above the dielectric layer; and etching away portions of the conductive material from above the dielectric layer to form a primary interconnect in electrical connection with the primary conductive pad and the secondary interconnect.

12. The method of claim 10, wherein said filling the primary and secondary vias and said forming the input/output connection are performed concurrently by:

depositing another dielectric layer different from and across the dielectric layer;

selectively etching away a portion of the another dielectric layer in and above the primary and secondary vias to expose the primary conductive pad; and filling the primary and secondary vias and forming the input/output connection above the primary and secondary vias with the same conductive material.

13. The method of claim 10, wherein the semiconductor topography is a die, the primary conductive pad is located near an edge of the die, and the secondary conductive pad is located near an interior of the die to allow for electrical testing near the interior.

14. The method of claim 10, wherein the structure is a Back End of the Line structure, and wherein the input/output connection is a solder ball connection or a wirebond connection.

15. The method of claim 10, further comprising, prior to said etching, determining a width of the secondary via or a toughness of a conductive material in the secondary via based on an estimated first ratio of a toughness of the secondary via to a toughness of a crack detected by the secondary via being greater than a second ratio of a toughness of the conductive material to a toughness of the dielectric layer.

16. The method of claim 11, wherein said forming the input/output connection comprises:

depositing another dielectric layer across the primary interconnect and an exposed region of the dielectric layer;

etching away a portion of the another dielectric layer to expose a portion of the primary interconnect above the primary conductive pad; and forming the input/output connection upon the exposed portion of the primary interconnect above the primary conductive pad.

17. A method of electrically testing a semiconductor die, comprising: supplying an electrical current to an input/output connection in electrical connection with a primary conductive pad spaced from a secondary conductive pad in an insulator, the primary conductive pad being in electrical connection with a circuit chip, and the secondary conductive pad being disposed near a periphery of the semiconductor die, wherein a primary conductive via extends through a dielectric layer down to the primary conductive pad for providing electrical connection between the input/output connection and the primary conductive pad, and wherein a secondary conductive via extends through the dielectric layer down to a secondary interconnect in electrical connection with the secondary conductive pad.

18. The method of claim 17, further comprising placing a test fixture in electrical connection with the input/output connection to measure electrical resistance.

19. The method of claim 17, wherein said supplying the electrical current is performed to detect Back End of the Line failure in-situ with circuit performance testing.

* * * * *